US006592940B1

(12) United States Patent
Myhill et al.

(10) Patent No.: US 6,592,940 B1
(45) Date of Patent: Jul. 15, 2003

(54) METHOD FOR COATING AN ORIFICE PLATE

(75) Inventors: Greg Myhill, Brookfield, CT (US); Norma Miller, New Milford, CT (US)

(73) Assignee: Illinois Tool Works, Inc., Glenview, IL (US)

(*) Notice: Subject to any disclaimer, the term of this patent is extended or adjusted under 35 U.S.C. 154(b) by 0 days.

(21) Appl. No.: 10/280,194

(22) Filed: Oct. 25, 2002

Related U.S. Application Data

(63) Continuation-in-part of application No. 10/126,277, filed on Apr. 19, 2002.
(60) Provisional application No. 60/322,653, filed on Sep. 17, 2001.

(51) Int. Cl.$^{7}$ .......................... C23C 16/00; B05D 1/32; B05D 5/08; B41J 2/135; B41J 2/14
(52) U.S. Cl. .............................. 427/248.1; 427/255.14; 427/282; 427/287; 347/45; 156/230
(58) Field of Search ................................ 156/230, 231, 156/232, 234, 235, 242, 247, 277, 289, 313, 272.2; 427/146, 147, 148, 58, 394, 400, 237, 255.14, 272, 282, 287; 347/44, 45, 46, 47

(56) References Cited

U.S. PATENT DOCUMENTS 5,212,496 A * 5/1993 Badesha et al. ............. 346/1.1
5,312,517 A * 5/1994 Ouki .......................... 156/643
5,443,687 A * 8/1995 Koyama et al. .............. 216/27
5,451,992 A * 9/1995 Shimomura et al. .......... 347/45
5,502,470 A * 3/1996 Miyashita et al. ............ 347/45

FOREIGN PATENT DOCUMENTS

JP 01-290438 * 11/1989 ............. B41J/3/04
JP 11006075 12/1999
JP 2001246753 11/2001

OTHER PUBLICATIONS

Cytonix Corporation Internet website: www.cytonix.com, entitled "Fluro Pel PFC602A", dated Apr. 30, 2002 (2 pages).
Xerox Corporation Internet website: www.Xerox.com, entitled, Diamond–like Carbon as an Overcoat for Thermal Ink Jet Heater Drums , dated Apr. 30, 2002 (1 page).

* cited by examiner

*Primary Examiner*—J. A. Lorengo
(74) *Attorney, Agent, or Firm*—Stroock & Stroock & Lavan LLP

(57) ABSTRACT

A method for coating an orifice plate and an orifice plate having a non-wetting coating thereon is provided. To form the plate, material having non-wetting characteristics can be provided as a surface of a transfer block. The non-wetting material is preferably Teflon (PTFE). The surface of the transfer block comprising non-wetting material can be pressed against the orifice plate, preferably under heating conditions. In one embodiment of the invention, the non-wetting surface is pressed against a spacer plate which is pressed against the orifice plate, preferably under heating conditions. The non-wetting material is vaporized and deposits on the surface of the orifice plate to coat the orifice plate with non-wetting material, but not the inside of the orifice.

16 Claims, 8 Drawing Sheets

METHOD FOR COATING AN ORIFICE PLATE

CROSS-REFERENCE TO RELATED APPLICATIONS

This application is a continuation-in-part of patent application Ser. No. 10/126,277 filed on Apr. 19. 2000, the contents of which are incorporated by reference which claims the benefit of Provisional application No. 60/322,653 filed Sep. 17, 2001.

BACKGROUND OF INVENTION

The invention relates generally to orifice plates for fluid jet printers and more particularly, to a method for depositing a non-wetting coating on the surface of the orifice plate without clogging the fluid jetting orifices.

Fluid jet printers produce images on a substrate by ejecting fluid drops onto the substrate in order to generate characters or images. Certain fluid jet printers are of the "continuous" type, where drops of fluid, such as ink, are continuously jetted through an orifice of a print head in a charged state. The charged droplets of are then electrostatically directed onto the printing substrate when printing is desired and into a gutter when printing is not desired Another type of a fluid jet printer is an "on demand" type printer. Drops of fluid, such as ink, are selectively jetted through an orifice of a print head when printing is desired and not jetted when no printing is desired.

An ink storage chamber is commonly connected to the print head via an ink flow passageway, to provide a constant flow of ink to the printer head. Ink jet heads generally employ capillary action between the ink and passageways in the ink jet head to position ink at the proper location in the head for proper jetting and drop formation. High pressure outside the print head can undesirably overcome the capillary action and force ink back into the head. Low pressure outside the print head can undesirably draw ink out of the head.

Ink is generally ejected through an orifice formed through an orifice plate. Buildup of material at the orifice can affect surface tension interactions, drop formation and disrupt proper operation. Ink buildup at the orifice surface can also attract dust, paper fibers and other debris and lead to clogging of the orifice. Ink present at the surface of the orifice can also lead to smearing and require increased distance between the orifice and the printing substrate, which leads to a decrease in print quality. Thus, it is desirable for the surface of the orifice plate to be non-wetting with respect to the fluid jetted through the orifice.

It is also advantageous for the inside of the ink passageways to be wetting. If the inside is wetting, ink will tend to coat all of the internal surfaces, proceed to a proper position in the print head and help air to exit from the ink passageways within the print head. If there is air inside the print head or the ink does not travel to the proper location, the jets might not operate properly.

Various commonly known non-wetting coating methods have proved inadequate. The holes in the orifice plate are generally small, commonly about 0.002 inches in diameter. This makes them very difficult to mask off during a coating operation. Thus, some methods that involve coating the surface of the orifice plate will inadvertently coat the inside of the orifices, leading to either clogging or improper wetting properties within the fluid passageway. Some non-wetting coating materials tend to be removed from the surface of the orifice plate either through contact with ink or when the orifice plate is cleaned with various cleaning solvents used to clean dried ink from the orifice plate.

Accordingly, it is desirable to provide an improved method of coating an orifice plate, to provide a non-wetting surface on the outside of the plate, while not clogging the orifices or coating the inner passageways within the orifices with the non-wetting material.

SUMMARY OF THE INVENTION

Generally speaking, in accordance with the invention, a method for coating an orifice plate and an orifice plate having a non-wetting coating thereon is provided.

To form the plate, material having non-wetting characteristics can be provided as a surface of a transfer block. The non-wetting material preferably comprises Teflon (PTFE). In one embodiment of the invention, the transfer block is a relatively soft material, which preferably has good heat transfer properties, such as aluminum. In another embodiment of the invention, the transfer block is made of the non-wetting material or has a thick layer of the non-wetting material on at least one surface. In another embodiment of the invention, a thin layer of the non-wetting material is disposed on the surface of a transfer block. In still another embodiment of the invention, the non-wetting material is disposed on the surface of a conformable material, such as a heat resistant elastomer, such as silicone.

The surface of the transfer block comprising the non-wetting material can be pressed against the orifice plate, preferably under heating conditions. In one embodiment of the invention, the non-wetting surface is pressed against a secondary transfer block to coat the secondary transfer block with the non-wetting material and the coated surface of this second block is pressed against the orifice plate, preferably under heating conditions. Additional transfers can be made in order to achieve a coated surface having the appropriate thickness and other characteristics to be transferred to the surface of the orifice plate, substantially to the edge of the orifice, but substantially not being deposited on the inner surface of the orifice plate defining the orifice. In this manner, proper printing operation can be achieved, but ink and other debris can be kept off the surface of the orifice plate.

In yet another embodiment of the invention, a layer of the non-wetting material is provided as the surface of a transfer block. A spacer plate having at least one opening formed therein is positioned against the orifice plate wherein the at least one opening of the spacer plate is aligned with the orifice, a group of orifices or a plurality of orifice groups in the orifice plate. The surface of the transfer block comprising the non-wetting material can be pressed against the spacer plate under heating conditions so that the spacer plate is positioned between the transfer block and the orifice plate. The non-wetting material is vaporized and transfers to the orifice plate where it deposits. Multiple transfers can be made from the same transfer block, to multiple orifice plates, in order to achieve coated surfaces of the orifice plates having the appropriate thickness and other characteristics, substantially to the edge of the orifices, but substantially not being deposited on the inner surfaces of the orifice plates defining the orifices. In this manner, proper printing operation can be achieved, but ink and other debris can be kept off the surface of the orifice plate.

The temperature at which transfer is effected depends on the thermal properties and heat resistance of the material to be transferred. If Teflon is to be transferred, temperatures over 400° F., more preferably over 500° F. and most preferably in the 550° F.–650° F. range can be used. Care should be taken so as not to heat the orifice plate and/or material to be transferred, to such an extent that the non-wetting material begins to degrade. The heat and pressure (if any) should be sufficient to transfer the non-wetting material onto the surface of the orifice plate without clogging or coating the orifices or adversely affecting the operation of the print head.

Accordingly, it is an object of the invention to provide an improved method for providing a non-wetting coating on an orifice plate for a fluid jet printer.

Another object of the invention is to provide an improved orifice plate for a fluid jetting print head, having a non-wetting coating on the outside surface thereof.

BRIEF DESCRIPTION OF THE DRAWINGS

For a fuller understanding of the invention, reference is made to the following drawings, which are not necessary drawn to scale, in which.

DETAILED DESCRIPTION OF THE PREFERRED EMBODIMENTS

Figure 1:
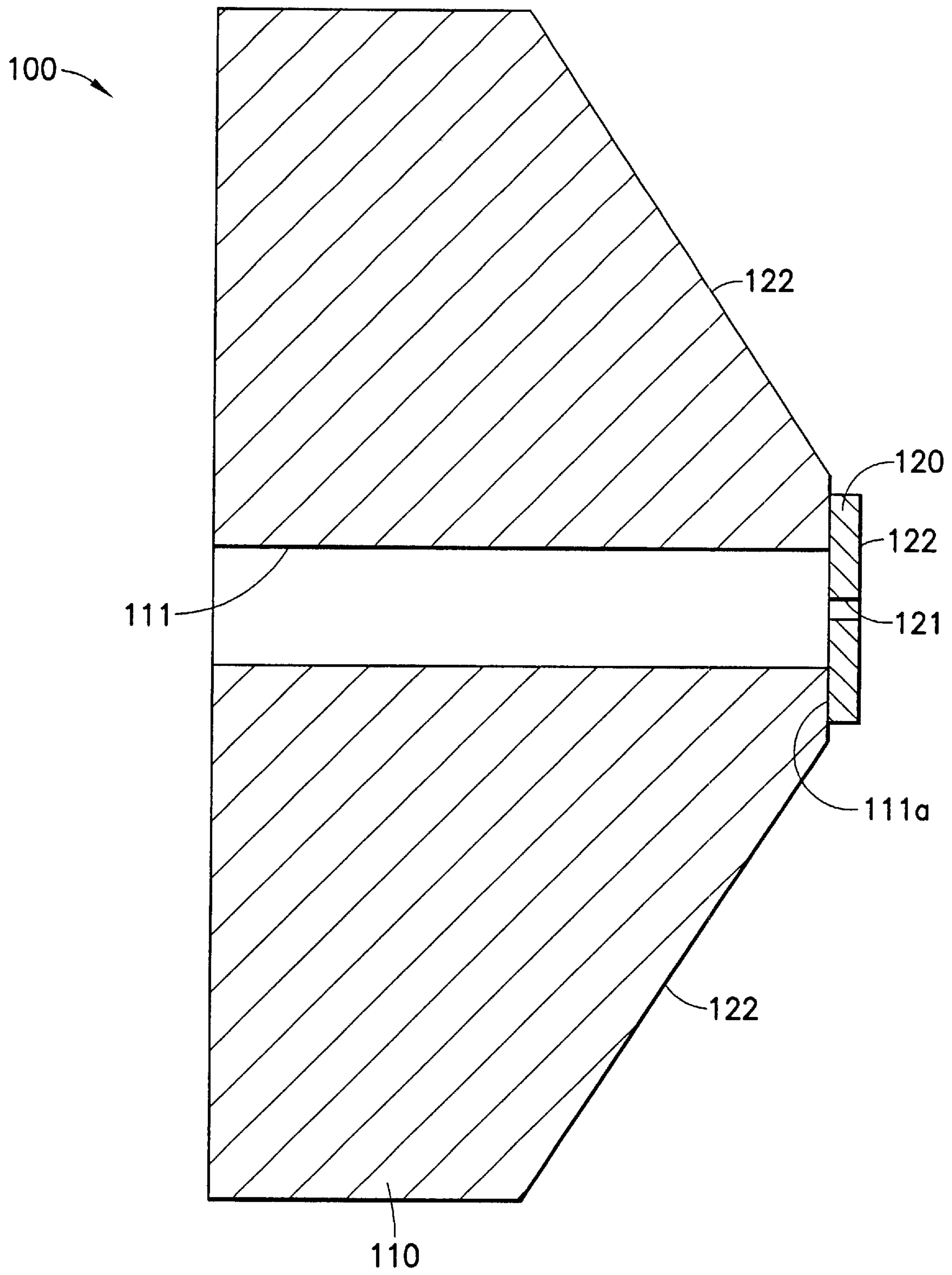
FIG. 1 is a cross sectional view of a chamber plate/orifice plate (CP/OP)

Orifice plates in accordance with the invention have a non-wetting surface that will help permit ink and other fluid substances and debris to roll off the surface of the plate and will help prevent accumulation problems.

According to the present invention, material having non-wetting characteristics is transferred by heat or pressure and preferably both, to the exterior surface of the orifice plate, preferably without clogging the orifice plate or negatively affecting the jetting performance of the orifice plate.

In a preferred embodiment of the invention, a Teflon (PTFE) solid film lubricant, such as one that contains no resins, such as Tiolon X20, sold by Tiodize Company of Huntington Beach, Calif., is coated, such as by spray coating, onto a transfer surface of a transfer block. Other known Teflon based non-wetting materials such as Endura, from Endura Coating Co.; A-20, E-20, 1000-S20, FEP Green, PTFE and X-40 from Tiodize; Cammie 2000 from AE Yale; 21845 from Ladd Research; MS122-22, MS 122DF, MS143DF, MS-122V MS-122VM, MS-143V, MS-136W, MS-145W, U0316A2, U0316B2, MS123, MS-125, MS-322 and MS-324 from Miller-Stephenson; and 633T2 from Oaao Bock can also be used. Various non-Teflon based non-wetting lubricant type materials include Dylyn, from ART; Nyebar, Diamonex, NiLAD, TI-DLN, Kiss-Cote, Titanium oxide; Fluocad Fluorochemical Coating FC-722, from 3M; Permacote from Dupont; Plasma Tech 1633 from Plasma Tech, Inc.; and silicone sprays. These materials should be selected after consideration of the material to be jetted and the substrate onto which jetting will occur. Thus, if the jetted fluid is aqueous based, the non-wetting material should be hydrophobic. If the substrate will be covered with oils or adhesives the material can be selected to be non-wetting to those substances.

The coated surface of the transfer block can be pressed against the surface of the orifice plate (or the chamber plate/orifice plate "CP/OP"), which will be the exterior of the print head, with an effective amount of force and/or heat to transfer an effective amount of the non-wetting coating material to the exterior surface of the CP/OP to significantly improve the non-wetting properties of the surface with respect to fluids, particularly aqueous based fluids and most particularly, inks. Transfers in accordance with the invention can also substantially prevent non-wetting material from becoming deposited on the inner surfaces of the plate that define the orifices.

It is advantageous to heat the transfer block, the orifice plate surface, or both, prior to performing the transfer process. The amount of heat will vary with the substance to be transferred. Heating should be to an effectively high temperature to ensure a thin transfer coat, but not high enough to degrade the material or to cause running, which could clog the orifices. When the non-wetting material is Teflon, the heating should be over 400° F., preferably over 500° F., most preferably in the range of 550° F.–650° F.

The temperature and the duration of the heating step should be controlled so as not to result in degradation of the non-wetting material. The duration of heating can vary, based on the characteristics of the oven and the heat sink characteristics of the orifice plate and contact and transfer surfaces. The temperature and/or duration of heating may also be optimized to result in the desired non-wetting coating.

Acceptable transfer surfaces include metal, wood, plastic, silicone, viton or any other surface that is sufficient to achieve such contact with the orifice plate so as to effectively and substantially uniformly transfer the non-wetting material to the surface of the plate and not the orifices. The transfer surface is coated with the non-wetting material and should release the non-wetting coating material sufficiently under heat and pressure. In one embodiment of the invention, the transfer block is polished aluminum. In another, it is stainless steel or more preferably stainless steel having a layer of a conformable material that has been coated with the non-wetting material. Alternatively, the transfer block itself may be formed from the non-wetting material, for example, a Teflon transfer block may be used, such that the first coating step is unnecessary.

The resulting orifice plate should have a thin coating of non-wetting material, such as Teflon thereon, which can be resistant to various typical cleaning operations and exhibit excellent non-wetting properties over acceptable durations of time. The thickness of the Teflon (or other non-wetting material) coating on the transfer surface should be adjusted, based on the characteristics of the orifice plate, including the size of the orifice holes, the type of Teflon transferred and other designed criteria. It has also been found that a coated transfer surface can be used to acceptably transfer an appropriate Teflon coating to 2, 3 and often more than 3 orifice plates before it needs to be recoated. Final coating thickness depends on the particular application. About 0.0002 inches is suitable for many applications. Other applications may be better suited to a 0.00004–0.0004 inch coating.

Orifice plates in accordance with preferred embodiments of the invention can have 72–140 orifices per inch, and orifices can be grouped in a circular orientation comprised of approximately seven orifices or a hexagon orientation with the seventh orifice in the center. Each orifice advantageously has an inner diameter of about 0.001 to 0.024 inches and a pitch of about 0.004 to 0.015 inches. Preferred orifices have a diameter of 0.002 inches.

Figure 3B:
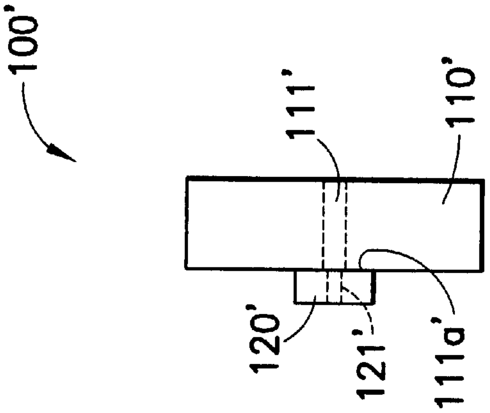
FIGS. 3(*a*), 3(*b*) and 3(*c*) are a top view, an end view and a side view, respectively, of a CP/OP in accordance with an embodiment of the invention.
Figure 3A:
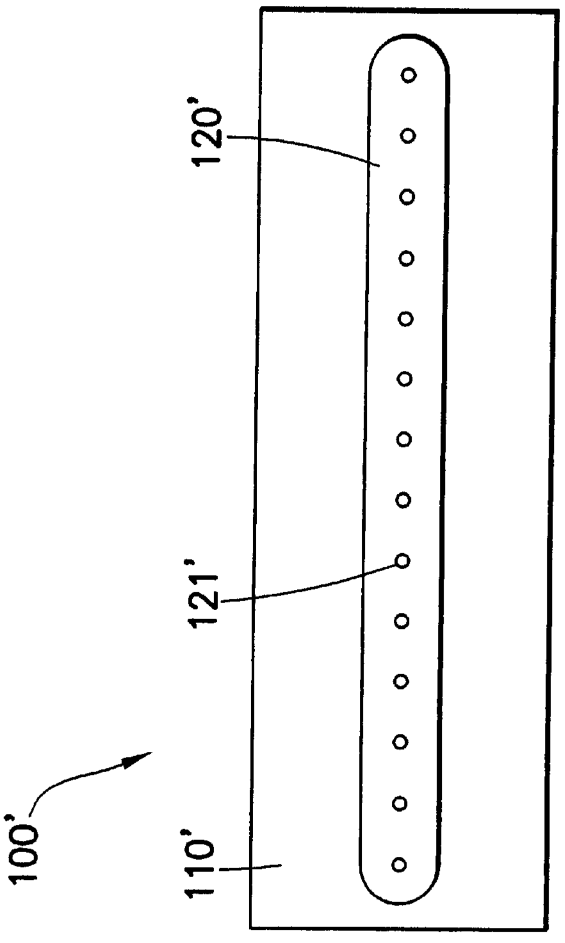
Figure 3C:
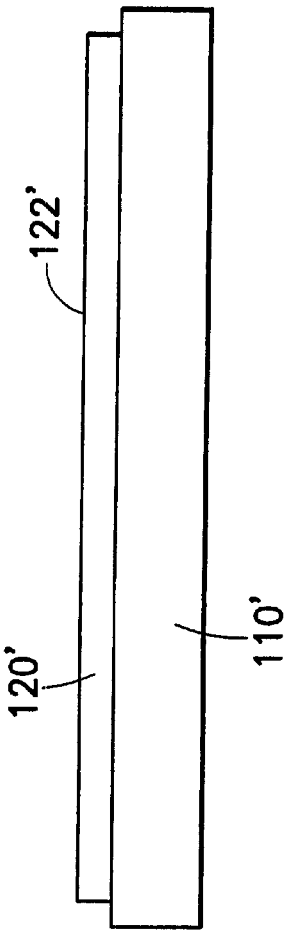

Referring to the figures, FIG. 1 shows a chamber plate ("CP") and orifice plate ("OP") (the "CP/OP") 100 comprising a chamber plate 110 having a chamber plate hole 111 therethrough and an orifice plate 120 having an orifice 121 therethrough, mounted on a front surface 111*a* of chamber plate 110. A non-wetting coating 122 is disposed over orifice plate 120 and chamber plate 110. A CP/OP structure 100' with flat surfaces, having a chamber plate 110' with a chamber plate hole 111' therethrough and an orifice plate 120' having an orifice 121' therethrough, mounted on a front surface 111*a'* of chamber plate 110' and a non-wetting coating 122' over orifice plate 120' is shown in FIGS. 3(*a*), 3(*b*), and 3(*c*).

Figure 2:
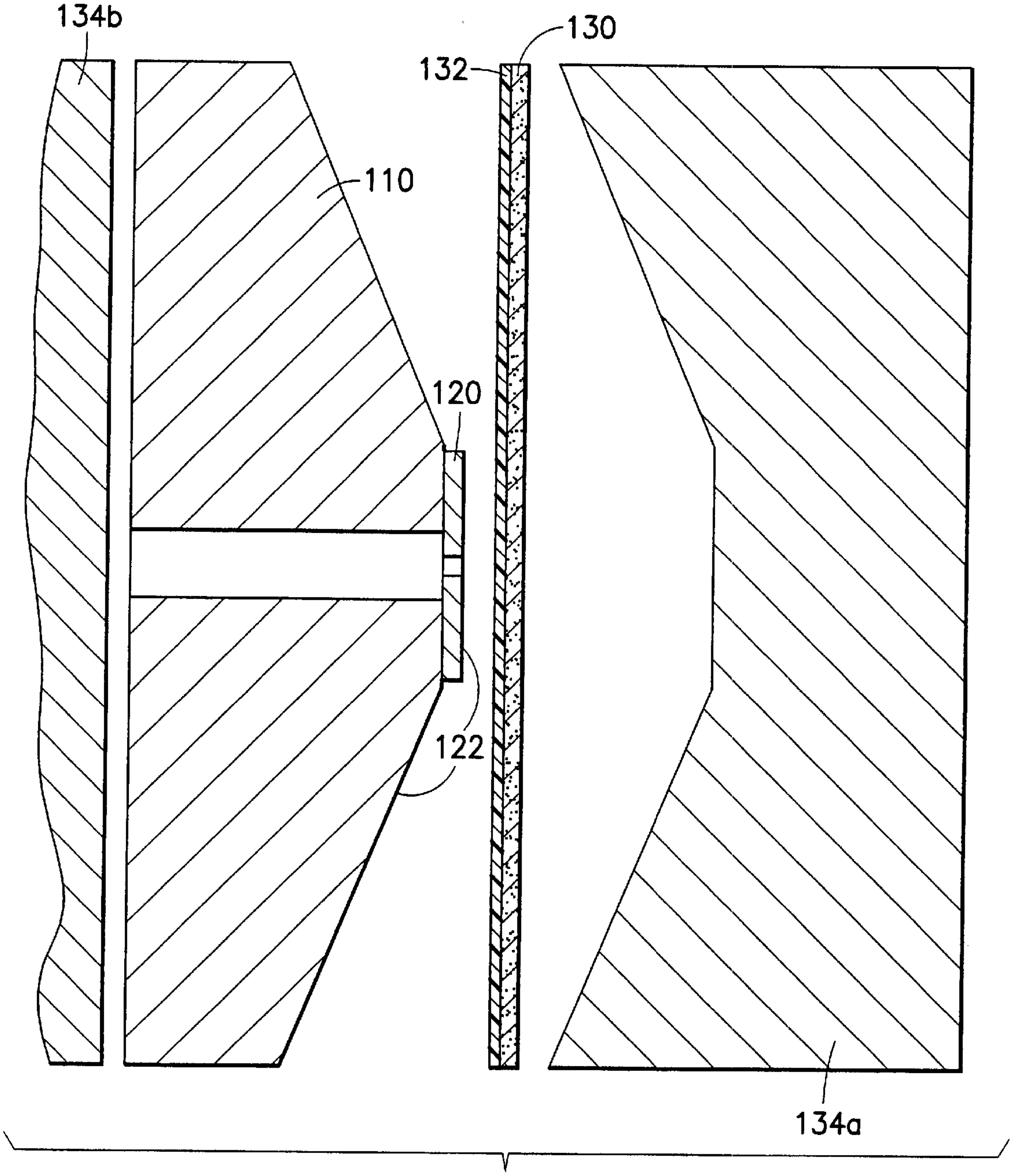
FIG. 2 is a cross sectional view of the CP/OP of FIG. 1 in relation to a coated silicone pad, prior to the pad being pressed against the CP/OP with a pressure plate, in accordance with an embodiment of the inventions.

If the surface of chamber plate 110 and orifice plate 120 to be coated by the non-wetting material has a complicated configuration (e.g., is non-planar, as shown in FIGS. 1 and 2), an elastomer sheet, such as a silicon pad 130, may be applied to a pressure plate 134*a* and a non-wetting material (e.g., Teflon) coating applied, such as by spray coating. Non-wetting material 132 can be transferred to the desired surfaces of CP/OP 100 by applying pressure with one or more pressure plates 134, including plate 134*a* having a profile that matches the profile of CP/OP 100, to ensure sufficient contact between coated silicon pad 130, CP/OP 100 and pressure plate 134 to transfer an effective non-wetting coating 122 from silicon pad 130 to CP/OP 100. A rear pressure plate 134*b* can be used to protect the rear of CP/OP 100.

Figure 5A:
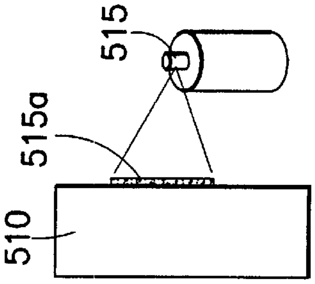
FIGS. 5(*a*), 5(*b*) and 5(*c*) are schematic views of the steps for applying a non-wetting coating to a CP/OP in accordance with an embodiment of the invention.
Figure 5B:
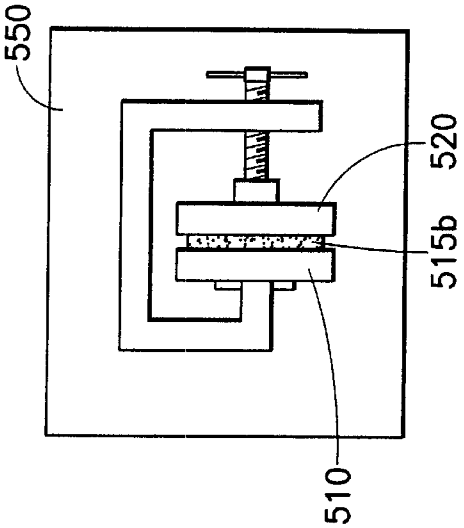
Figure 5C:
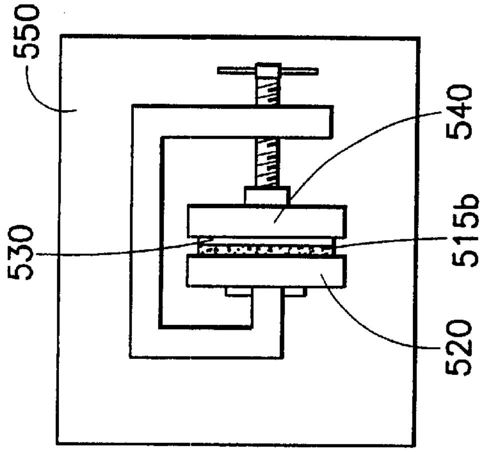

A method of coating an orifice plate 530 of a CP/OP 540 is shown with reference to FIGS. 5(*a*) to 5(*c*). A Teflon coating 515 is sprayed onto a first transfer block 510 to form a Teflon coating layer 515*a*. It has been found that the resulting Teflon coating layer 515*a* is often too thick and can clog orifice holes when the surface of first transfer block 510 having coating layer 515*a* thereon is pressed against an orifice plate. Thus, it can be first pressed against a second transfer block 520 and heated for an effective amount of time in an oven 550 to form a layer of Teflon 515*b* on second transfer block 520. At this point, yet another transfer to another transfer block can be effected, or as shown in FIG. 5(*c*), layer 515*b* on second transfer block 520 can be pressed against orifice plate 530 of CP/OP 540, under heating conditions in oven 550 to deposit the non-wetting coating on orifice plate 530.

Figure 4:
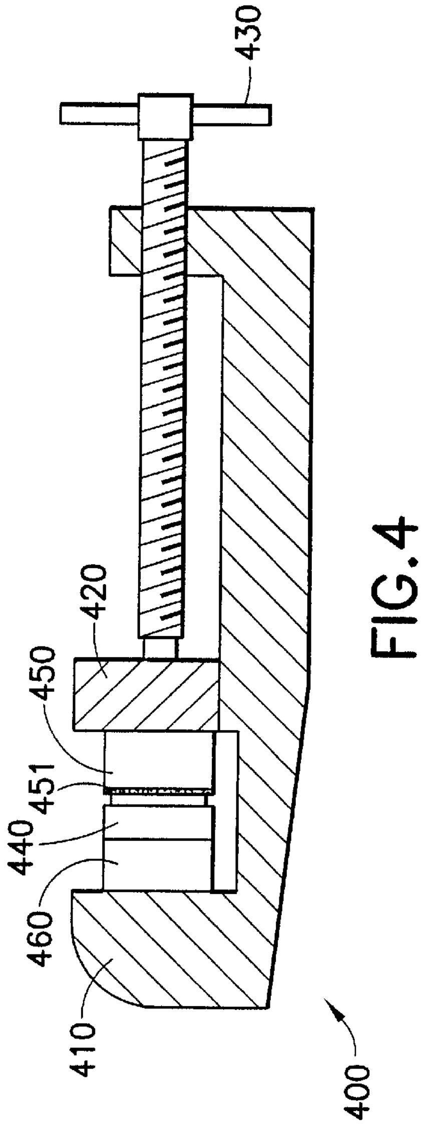
FIG. 4 is a schematic view of a device for applying a non-wetting coating to a CP/OP.

A press 400 for pressing a transfer block onto the orifice plate of a CP/OP is shown in greater detail in FIG. 4. Press 400 includes a fixed jaw 410 and a movable jaw 420. Turning a knob 430 can advance movable jaw 420 towards fixed jaw 410 to press a front surface of a CP/OP 440 against a coated surface 451 of an aluminum transfer block 450. A backing block 460 which should be made of a relatively soft material such as aluminum can be used to protect the back of CP/OP 440. The entire assembly can then be placed into an oven. Other heating methods, such as induction heating or placing heating elements in press 400 can be employed. Also, the orientation with respect to moving jaw 420 can be reversed.

Figure 6B:
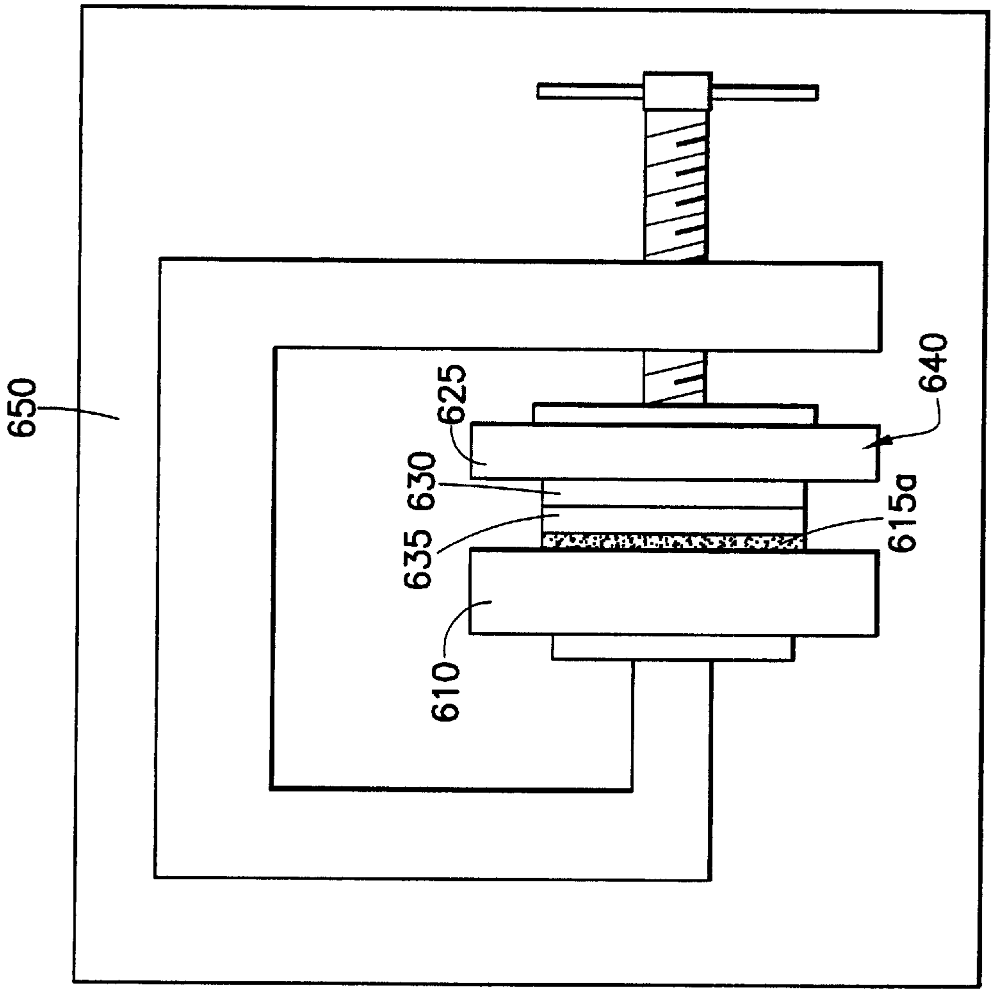
FIGS. 6(*a*) and 6(*b*) are schematic views of the steps for applying a non-wetting coating to a CP/OP in accordance with an embodiment of the invention.
Figure 6A:
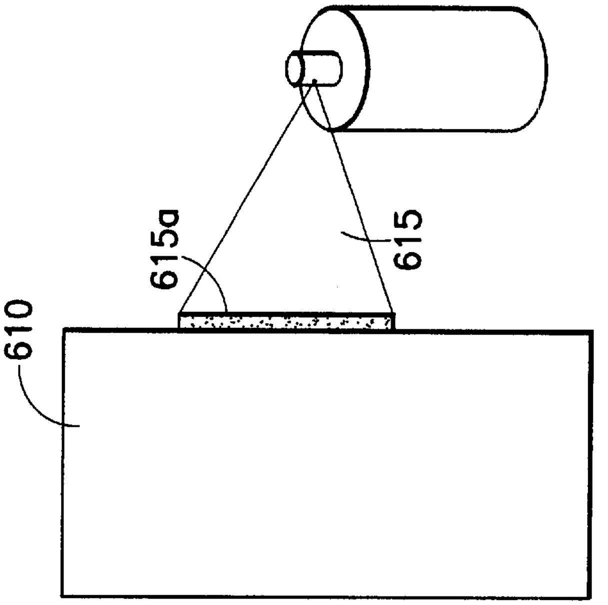

Referring to FIGS. 6(*a*), 6(*b*), 7, 8, and 9 an alternative method of coating an orifice plate 630 of a CP/OP 640 is shown. CP/OP 640 being comprised of the orifice plate 630, having at least one orifice 641 formed therein, and a chamber plate 625. A Teflon coating 615 is sprayed or otherwise applied onto a transfer block 610 to form a Teflon coating layer 615*a* thereon as shown in FIG. 6(*a*). In certain embodiments of the invention, an entire block of non-wetting material can be used. A spacer plate 635 is advantageously disposed between transfer block 610, having coating layer 615*a* thereon, and orifice plate 630, as shown in FIG. 6(*b*). Acceptable materials for the spacer plate 635 include stainless steel, nickel or any other material having similar properties.

Spacer plate 635 should be thin enough to permit acceptable vapor transfer of the non-wetting material during the heating step. It should, however, be thicker than the layer of material to be applied. Acceptable thicknesses for the spacer plate 635 are in the range of 0.0005 to 0.031 inches, more preferably in the range of 0.001 to 0.010 inches.

The transfer block 610 having coating layer 615*a* thereon, the spacer plate 635 having at least one opening 637 formed therein and the CP/OP 640, comprised of chamber plate 625 and orifice plate 630, are placed together and heated for an effective amount of time in an oven 650 to vaporize and deposit the non-wetting coating on orifice plate 630. Opening 637 of spacer plate 635 allows a portion of the coating layer 615*a* to vapor transfer to the orifice plate 630. This method has been determined to transfer an effective amount of non-wetting coating to orifice plate 630 without clogging orifice 641 formed therein. Although the mechanics are not fully understood, it is believed that because the diameter of orifices 641 is so small, that relatively few wetting material molecules migrate therein. Thus, substantially all of the material is deposited on the surface of orifice plate 630 and sufficiently little coats the inside of orifices 641.

Figure 7:
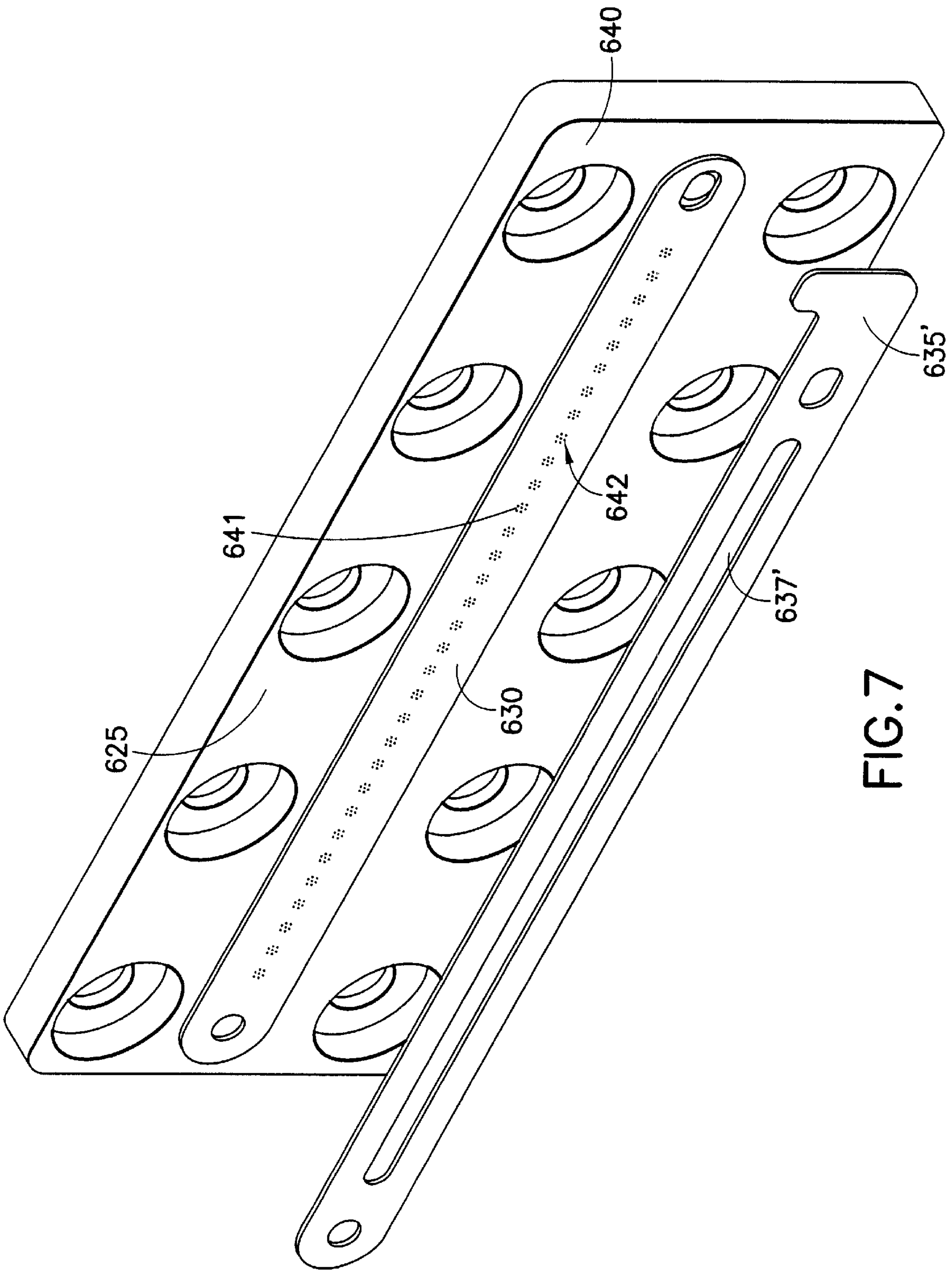
FIG. 7 is a perspective view of a CP/OP in relation to a spacer plate, prior to the spacer plate being pressed against the CP/OP, in accordance with an embodiment of the invention.

Opening 637 of spacer plate 635 can be elongated into a slot shape as depicted in FIG. 7 having a width sufficient to expose the surface of orifices 641. In a preferred embodiment of the invention, with reference to FIGS. 8 and 9, a plurality of openings 537' is shown, each opening 537' being of sufficient diameter to expose the surface of orifice plate 630 surrounding orifices 641. Opening 537' having a diameter of approximately 0.052 inches is acceptable; other acceptable diameters of opening 537' can be in the range of about 0.010 to about 0.080 inches.

Figure 8:
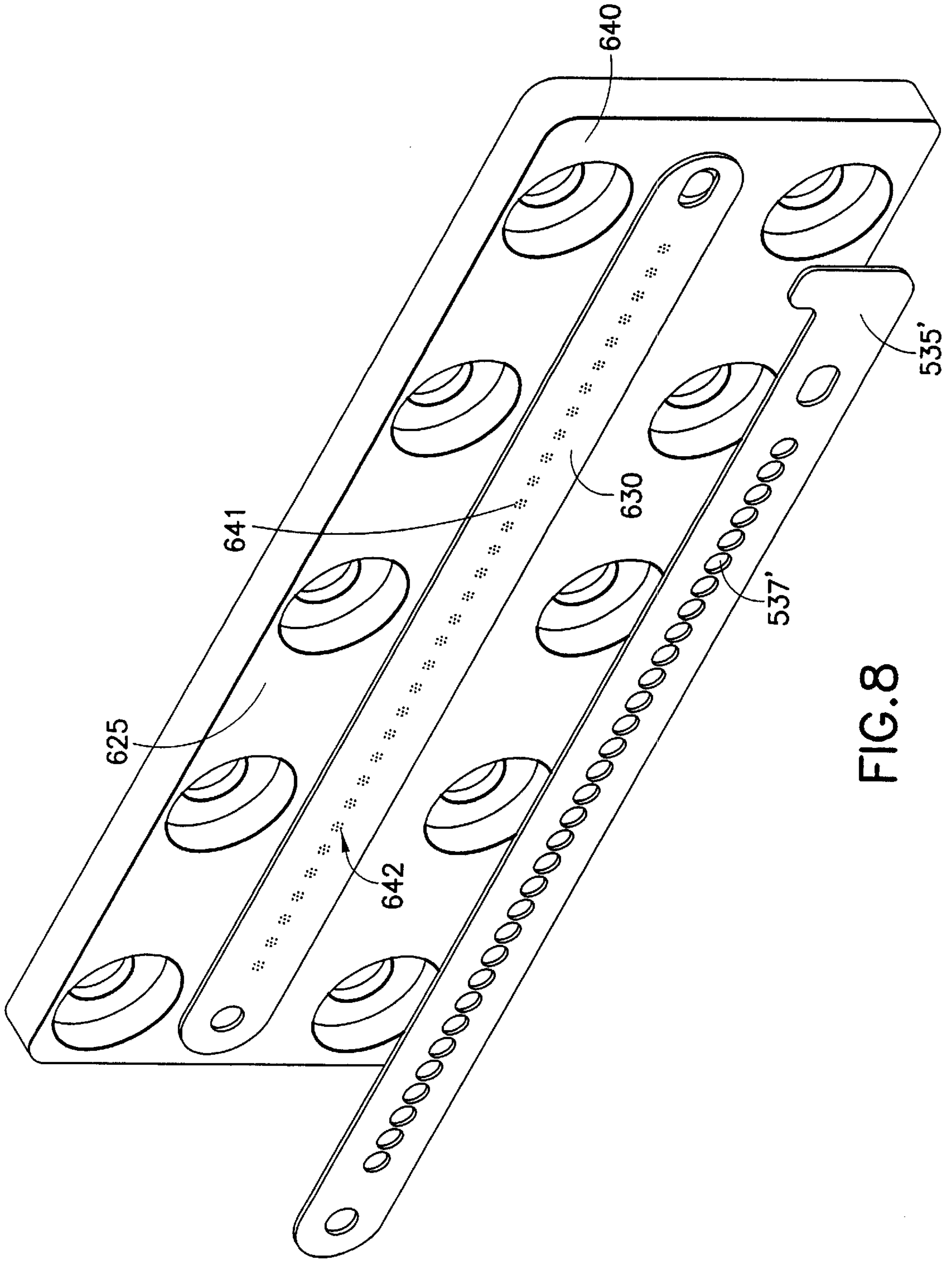
FIG. 8 is a perspective view of a CP/OP in relation to a spacer plate, prior to the spacer plate being pressed against the CP/OP, in accordance with an embodiment of the invention.
Figure 9:
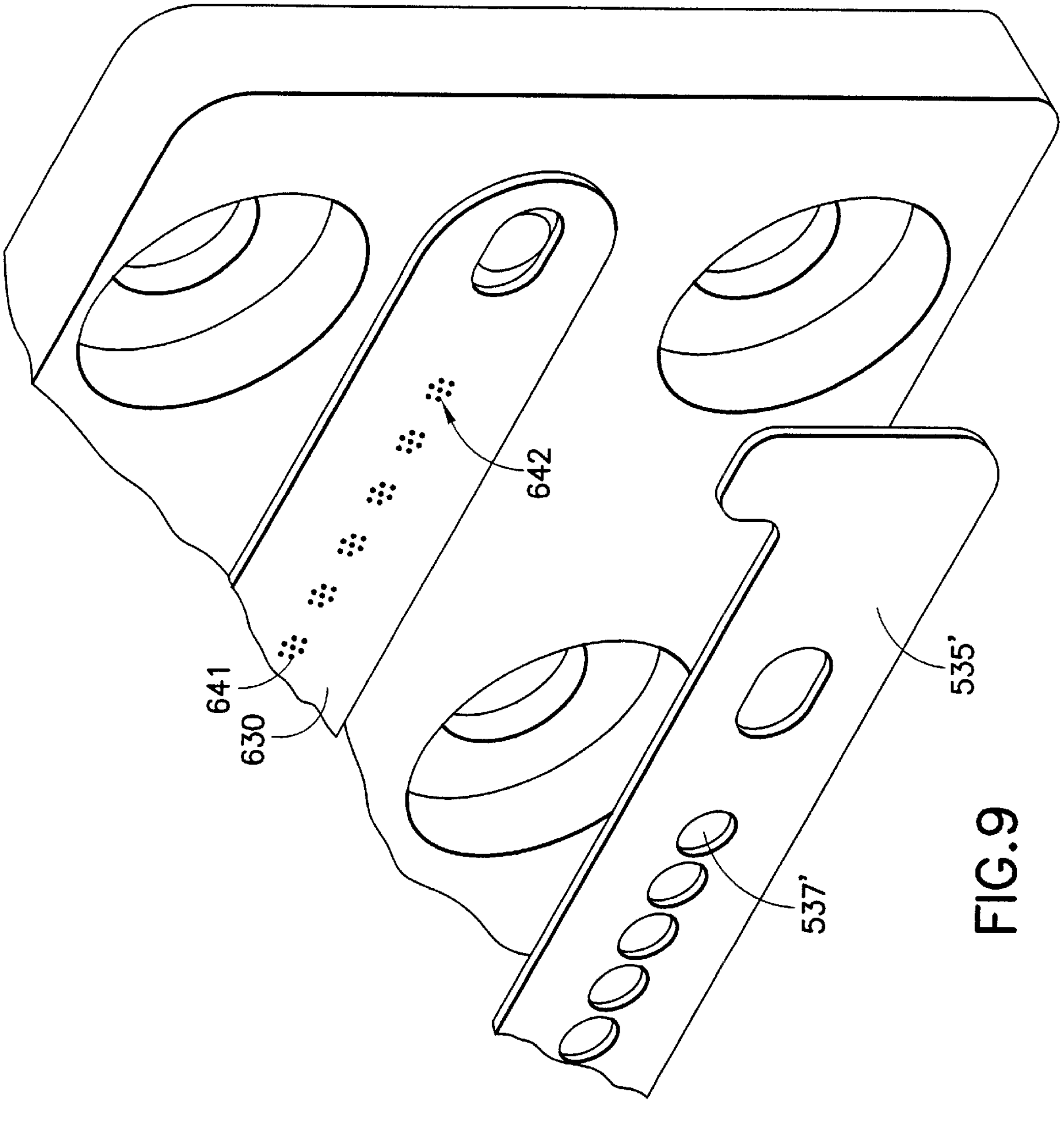
FIG. 9 is an enlarged partial perspective view of the CP/OP of FIG. 8 in relation to a spacer plate, prior to the spacer plate being pressed against the CP/OP, in accordance with an embodiment of the invention.

With continued reference to FIGS. 7, 8 and 9, CP/OP 640 comprising chamber plate 625 and orifice plate 630 is depicted. Orifice plate 630 is shown with a plurality of orifices 641 formed therethrough wherein the plurality of orifices 641 are provided in orifice groups 642. As shown most clearly in FIG. 9, orifices 641 of orifice group 642 can be formed in the shape of a hexagon, with one orifice at each vertex and a seventh in the middle. Of course, other arrangements are acceptable. Each orifice group can be formed with one to fifteen and even more orifices per group. Orifice plate 630 is depicted as having a plurality of groups of orifices 641, preferably between twenty and forty groups of orifices.

FIG. 7 further depicts a spacer plate 635' having a single opening 637' formed therethrough in accordance with the present invention. FIG. 8 depicts a spacer plate 535' having a plurality of openings 537' formed therethrough in accordance with the present invention.

It will thus be seen that the objects set forth above, among those made apparent from the preceding description, are efficiently attained and, since certain changes may be made in carrying out the above method and in the articles set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. A method for coating an orifice plate with a material that is non-wetting to a selected material, comprising:

providing a plate defining at least one orifice defined by orifice walls therein, the plate having a front surface and providing a transfer surface formed of non-wetting material;

positioning the transfer surface adjacent the plate, with a spacer therebetween, the spacer constructed to provide an open space for fluid communication between the transfer surface and the surface of the plate adjacent the orifice;

heating the transfer surface to a temperature effective to vaporize the non-wetting material and permitting the vaporized non-wetting material to coat the surface of the plate adjacent the orifice, the transfer surface spacer and plate constructed and arranged and heated to an effective temperature to coat the surface of the plate adjacent and substantially up to the edge of the orifice, but substantially not the surface of the orifice walls.

2. The method of claim 1, wherein the transfer surface is formed by spraying a composition comprising the non-wetting material onto a face of a transfer block.

3. The method of claim 1, wherein the orifice plate is sized and configured to act as the orifice plate for an ink jet print head.

4. The method of claim 1, wherein the at least one orifice is less than about 0.024 inches in diameter.

5. The method of claim 1, wherein the orifice is about 0.001 to 0.024 inches in diameter.

6. The method of claim 1, wherein the non-wetting material is non-wetting to aqueous materials.

7. The method of claim 1, wherein the non-wetting material is non-wetting to oil-based materials.

8. The method of claim 1, wherein the non-wetting material comprises PTFE.

9. The method of claim 1, wherein the non-wetting material at the transfer surface of the non-wetting material is a Teflon lubricant substantially free of resins.

10. The method of claim 1, wherein the heating is to over 400° F.

11. The method of claim 1, wherein the heating is in the range of 500° F. to 650° F.

12. The method of claim 1, wherein the plate comprises a plurality of orifices and the spacer is in the form of a plate having an elongated slot defining the open space and the slot formed in the spacer plate is elongated to expose the orifices formed in the orifice plate to the transfer surface.

13. The method of claim 1, wherein the non-wetting material is coated to a thickness of 0.00004 up to 0.001 inches.

14. The method of claim 1, wherein the spacer is in the form of a plate 0.0005 to 0.031 inches thick and having at least one aperture therethrough to define the open space.

15. The method of claim 1, wherein the orifice plate comprises groups of multiple orifices and the spacer is in the form of a plate having an aperture therethrough corresponding to each group of orifices.

16. The method of claim 15, wherein the aperture formed in the spacer plate has a circular diameter of approximately 0.052 inches.

* * * * *